(12) United States Patent
Kim et al.

(10) Patent No.: US 11,749,630 B2
(45) Date of Patent: Sep. 5, 2023

(54) INTERCONNECT STRUCTURE AND SEMICONDUCTOR CHIP INCLUDING THE SAME

(71) Applicant: Samsung Electronics Co., Ltd., Suwon-si (KR)

(72) Inventors: Byungwook Kim, Suwon-si (KR); Ayoung Kim, Yongin-si (KR); Haeseong Jeong, Seongnam-si (KR); Sangsu Ha, Suwon-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 32 days.

(21) Appl. No.: 17/199,674

(22) Filed: Mar. 12, 2021

(65) Prior Publication Data

US 2022/0052005 A1 Feb. 17, 2022

(30) Foreign Application Priority Data

Aug. 12, 2020 (KR) .................. 10-2020-0101394

(51) Int. Cl.
*H01L 23/528* (2006.01)
*H01L 23/532* (2006.01)
*H01L 23/00* (2006.01)

(52) U.S. Cl.
CPC ............ *H01L 24/14* (2013.01); *H01L 23/528* (2013.01); *H01L 23/53214* (2013.01); *H01L 23/53228* (2013.01); *H01L 23/562* (2013.01)

(58) Field of Classification Search
CPC ...... H01L 23/522; H01L 23/528; H01L 24/10; H01L 24/14; H01L 24/02–06;
(Continued)

(56) References Cited

U.S. PATENT DOCUMENTS 6,762,495 B1 7/2004 Reyes et al.
7,378,720 B2* 5/2008 Fu .................... H01L 23/585
257/757

(Continued)

FOREIGN PATENT DOCUMENTS

CN 001212661 C 7/2005
JP 2001053427 A 2/2001

*Primary Examiner* — Phat X Cao
*Assistant Examiner* — William Henry Anderson
(74) *Attorney, Agent, or Firm* — Harness, Dickey & Pierce, P.L.C.

(57) ABSTRACT

A semiconductor chip includes a back end of line (BEOL) structure on a first surface of the semiconductor substrate and including a conductive connection structure and an interlayer insulating layer covering the conductive connection structure, a conductive reinforcing layer arranged on the BEOL structure, a cover insulating layer covering the conductive reinforcing layer, an under bump metal (UBM) layer including a plurality of pad connection portions connected to the conductive reinforcing layer through openings in the cover insulating layer, and a plurality of first connection bumps arranged on the plurality of pad connection portions of the UBM layer, electrically connected to one another through the conductive reinforcing layer, and located to overlap the conductive reinforcing layer. The conductive reinforcing layer has a plate shape and extends parallel to the first surface of the semiconductor substrate.

19 Claims, 13 Drawing Sheets

(58) Field of Classification Search
CPC ....... H01L 24/26–30; H01L 2224/0601; H01L 2224/0605–061; H01L 2224/0612; H01L 2224/06179; H01L 2224/02125; H01L 2224/02165; H05K 2201/09209–09436
See application file for complete search history.

(56) References Cited

U.S. PATENT DOCUMENTS

| | | |
|---|---|---|
| 8,125,789 B2 | 2/2012 | Nishimura |
| 8,237,160 B2 | 8/2012 | Chen et al. |
| 8,237,274 B1 | 8/2012 | Rahman |
| 8,441,131 B2 | 5/2013 | Ryan |
| 8,624,404 B1* | 1/2014 | Su .......................... H01L 24/14 |
| | | 257/781 |
| 9,554,453 B2 | 1/2017 | Hsiao |
| 2005/0062151 A1 | 3/2005 | Nagao |
| 2008/0012097 A1 | 1/2008 | Takahashi et al. |
| 2011/0316153 A1* | 12/2011 | Nagai ..................... H01L 24/03 |
| | | 257/737 |
| 2015/0162318 A1* | 6/2015 | Allinger ............. G01R 31/2884 |
| | | 257/48 |
| 2015/0228587 A1* | 8/2015 | Cheng .................. H01L 23/544 |
| | | 257/777 |
| 2019/0131242 A1* | 5/2019 | Lee ..................... H01L 23/3128 |
| 2019/0206832 A1* | 7/2019 | Kang ................... H01L 23/528 |
| 2020/0083201 A1* | 3/2020 | Suk ........................ H01L 24/09 |

* cited by examiner

INTERCONNECT STRUCTURE AND SEMICONDUCTOR CHIP INCLUDING THE SAME

CROSS-REFERENCE TO RELATED APPLICATION

This application is based on and claims priority under 35 U.S.C. § 119 to Korean Patent Application No. 10-2020-0101394, filed on Aug. 12, 2020, in the Korean Intellectual Property Office, the disclosure of which is incorporated by reference herein in its entirety.

BACKGROUND

Inventive concepts relate to an interconnect structure and/or a semiconductor chip including the interconnect structure.

Stress occurs due to a difference in the thermal expansion coefficients between the individual components constituting a semiconductor chip or semiconductor package, and this stress may cause mechanical defects and/or electrical defects in the semiconductor chip or semiconductor package. Nowadays, as semiconductor chips and semiconductor packages are gradually miniaturized and thinned according to the recent trend of light and thinner electronic devices, the effect of stress acting on the semiconductor chips or semiconductor packages may be gradually increasing and the reliability of the semiconductor chips or semiconductor packages may be gradually decreasing.

SUMMARY

Inventive concepts provide an interconnect structure and/or a semiconductor chip including the interconnect structure.

According to an example embodiment, a semiconductor chip may include substrate; a back end of line (BEOL) structure on a first surface of the semiconductor substrate, the BEOL structure including a conductive connection structure and an interlayer insulating layer covering the conductive connection structure; a conductive reinforcing layer on the BEOL structure, the conductive reinforcing layer being electrically connected to the conductive connection structure and having a plate shape extending parallel to the first surface of the semiconductor substrate; a cover insulating layer covering the conductive reinforcing layer; an under bump metal (UBM) layer including a plurality of pad connection portions connected to the conductive reinforcing layer through openings of the cover insulating layer; and a plurality of first connection bumps on the plurality of pad connection portions of the UBM layer. The plurality of first connection bumps may be electrically connected to one another through the conductive reinforcing layer, and may overlap the conductive reinforcing layer in a direction perpendicular to the first surface of the semiconductor substrate.

According to an example embodiment, an interconnect structure may include an under bump metal (UBM) layer including a plurality of pad connection portions; a plurality of connection bumps attached to the plurality of pad connection portions; and a conductive reinforcing layer electrically connected to the plurality of connection bumps through the UBM layer. The conductive reinforcing layer may have a plate shape with an area overlapping at least a portion of each of the plurality of connection bumps.

According to an example embodiment, a semiconductor chip may include a semiconductor substrate; a back end of line (BEOL) structure on a first surface of the semiconductor substrate, the BEOL structure including a first conductive connection structure, a second conductive connection structure, and an interlayer insulating layer covering the first conductive connection structure and the second conductive connection structure; a conductive reinforcing layer on the BEOL structure, the conductive reinforcing layer being electrically connected to the first conductive connection structure and having a plate shape extending parallel to the first surface of the semiconductor substrate; a pad layer on the BEOL structure and electrically connected to the second conductive connection structure; a cover insulating layer covering the conductive reinforcing layer and the pad layer; a first under bump metal (UBM) layer including a plurality of pad connection portions connected to the conductive reinforcing layer through first openings in the cover insulating layer; a second UBM layer connected to the pad layer through second openings in the cover insulating layer; a plurality of first connection bumps on the plurality of pad connection portions of the first UBM layer, the plurality of first connection bumps being electrically connected to the conductive reinforcing layer; and a second connection bump on the second UBM layer. The plurality of first connection bumps, the first UBM layer, the conductive reinforcing layer, and the first conductive connection structure may be electrically connected to one another.

BRIEF DESCRIPTION OF THE DRAWINGS

Embodiments of inventive concepts will be more clearly understood from the following detailed description taken in conjunction with the accompanying drawings in which.

DETAILED DESCRIPTION

Figure 1:
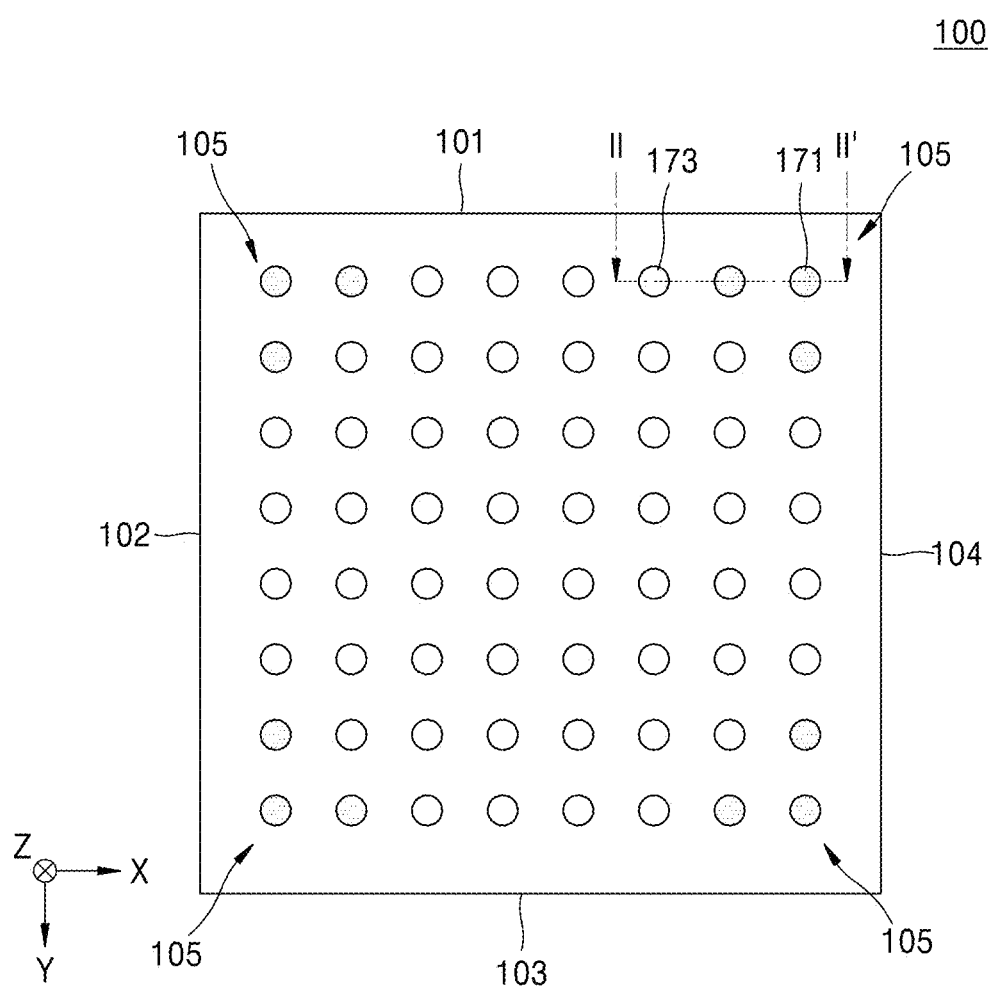
FIG. 1 is a bottom view illustrating a bottom surface of a semiconductor chip according to example embodiments.

Hereinafter, embodiments of inventive concepts will be described in detail with reference to the accompanying drawings. The same reference numerals are used for the same components in the drawings, and redundant descriptions thereof are omitted.

Figure 2:
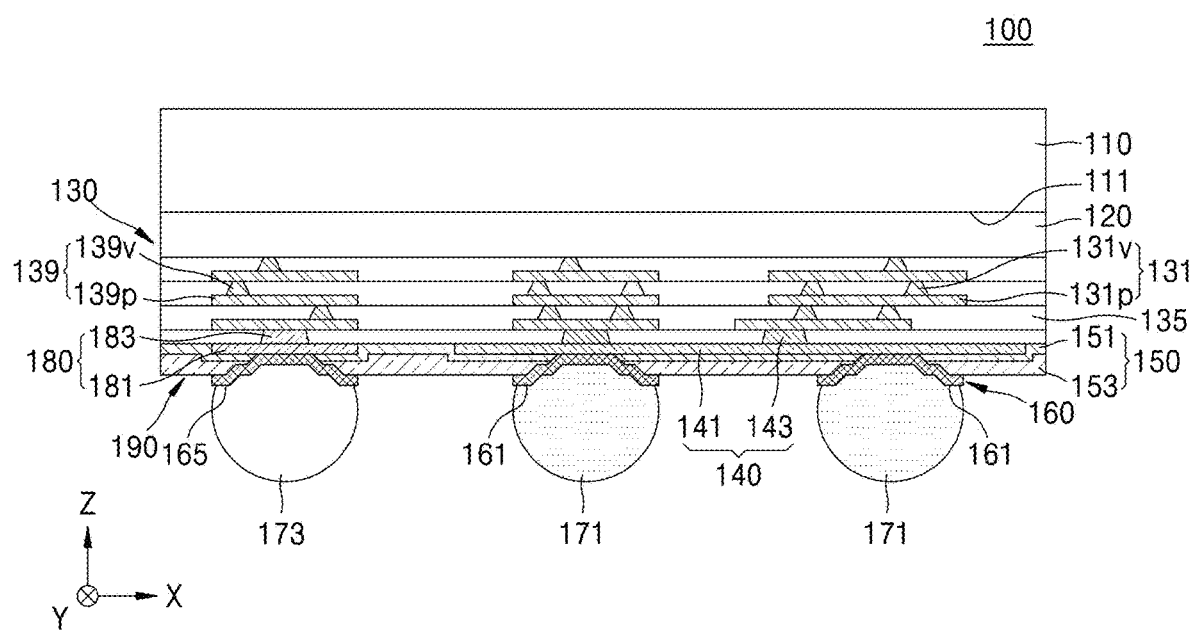
FIG. 2 is a cross-sectional view of the semiconductor chip taken along line II-II' of FIG. 1.
Figure 3:
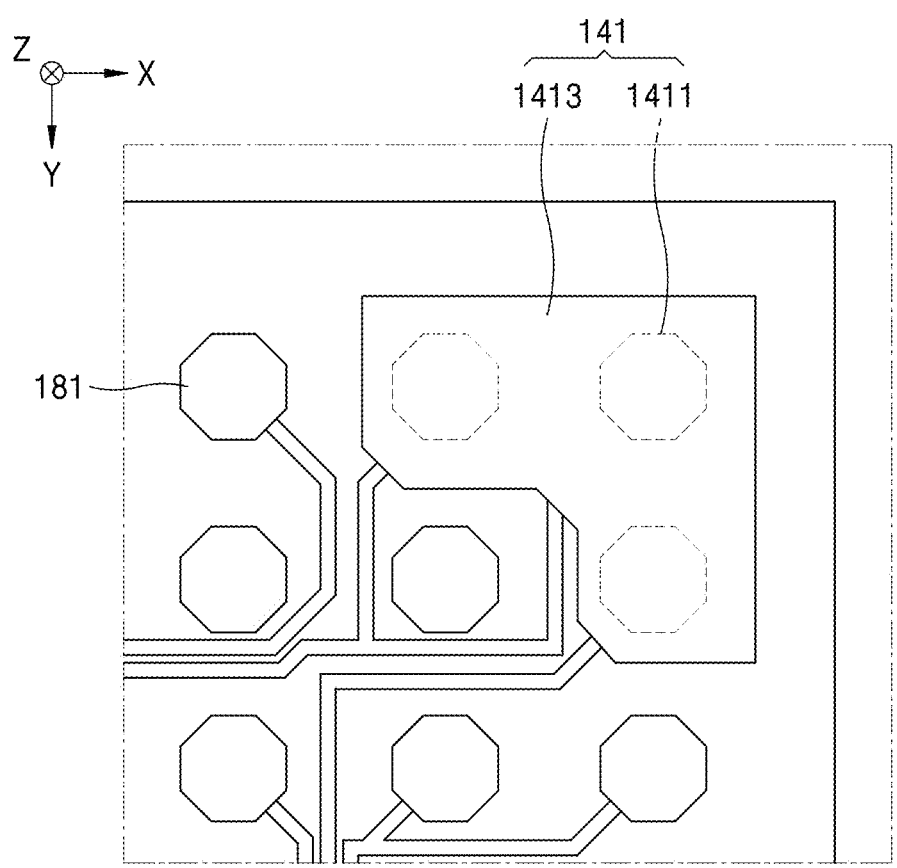
FIG. 3 is a plan view illustrating a conductive reinforcing layer and a pad layer of FIG. 1.

FIG. 1 is a bottom view illustrating a bottom surface of a semiconductor chip 100 according to example embodiments. FIG. 2 is a cross-sectional view of the semiconductor chip 100 taken along line II-II' of FIG. 1. FIG. 3 is a plan view illustrating a conductive reinforcing layer 140 and a pad layer 180 of FIG. 1.

Referring to FIGS. 1 to 3, the semiconductor chip 100 may include a plurality of connection bumps. The plurality of connection bumps may be arranged in the form of a two-dimensional array on the bottom surface of the semiconductor chip 100. That is, the plurality of connection bumps may be arranged in two or more rows and two or more columns. The plurality of connection bumps may be, for example, pillars, bumps, or ball-shaped connection structures. The plurality of connection bumps may include a conductive material, for example, solder, copper (Cu), or the like.

The plurality of connection bumps may include a plurality of first connection bumps 171 arranged in corner regions 105 that are regions near vertices where edges of the bottom surface of the semiconductor chip 100 meet, and a plurality of second connection bumps 173 other than the plurality of first connection bumps 171. The plurality of first connection bumps 171 may be electrically connected to each other. For example, the plurality of first connection bumps 171 may be electrically connected to each other through the conductive reinforcing layer 140 to be described later, and may include terminals that perform the same function. In example embodiments, the plurality of first connection bumps 171 may be configured to receive a ground voltage from an external device. The plurality of second connection bumps 173 may be electrically and functionally separated from the plurality of first connection bumps 171. The plurality of second connection bumps 173 may include terminals configured to receive a data input/output signal, a driving voltage, and/or a ground voltage from an external device.

For example, as illustrated in FIG. 1, the bottom surface of the semiconductor chip 100 may have a quadrangular shape including first to fourth edges 101, 102, 103, and 104, and may include four corner regions 105 that are near vertices where two adjacent edges among the first to fourth edges 101, 102, 103, and 104 meet. A plurality of first connection bumps 171 may be arranged in each of the four corner regions 105. In FIG. 1, it is illustrated that three first connection bumps 171 are arranged in each of the four corner regions 105. However, the number of first connection bumps 171 arranged in each corner region 105 is not limited thereto. For example, each corner region 105 may include four or more first connection bumps 171 within a certain distance from a vertex in each corner region 105.

In example embodiments, the semiconductor chip 100 may be a memory chip. For example, the semiconductor chip 100 may include a volatile memory chip and/or a nonvolatile memory chip. The volatile memory chip may be, for example, dynamic random access memory (DRAM), high bandwidth memory (HBM) DRAM, static RAM (SRAM), thyristor RAM (TRAM), zero capacitor RAM (ZRAM), or twin transistor RAM (TTRAM). In addition, the nonvolatile memory chip may be, for example, flash memory, magnetic RAM (MRAM), spin-transfer torque MRAM (STT-MRAM), ferroelectric RAM (FRAM), phase change RAM (PRAM), resistive RAM (RRAM), nanotube RRAM, polymer RAM, or insulator resistance change memory.

In example embodiments, the semiconductor chip 100 may be a logic chip. For example, the semiconductor chip 100 may be a central processing unit (CPU), a graphic processing unit (GPU), or an application processor (AP).

The semiconductor chip 100 may include a semiconductor substrate 110, a front end of line (FEOL) structure 120, a back end of line (BEOL) structure 130, a conductive reinforcing layer 140, a pad layer 180, a cover insulating layer 150, a first under bump metal (UBM) layer 160 to which a plurality of first connection bumps 171 are attached, and a second UBM layer 165 to which a plurality of second connection bumps 173 are attached. The BEOL structure 130, the conductive reinforcing layer 140, the pad layer 180, the cover insulating layer 150, the first UBM layer 160, and the second UBM layer 165 may constitute an interconnect structure 190.

The semiconductor substrate 110 may include a first surface 111 and a second surface, that are opposite to each other. The first surface 111 of the semiconductor substrate 110 may be an active surface of the semiconductor substrate 110, and the second surface of the semiconductor substrate 110 may be an inactive surface of the semiconductor substrate 110.

The semiconductor substrate 110 may be a semiconductor wafer. The semiconductor substrate 110 may include, for example, silicon (Si). Alternatively, the semiconductor substrate 110 may include a semiconductor element such as germanium, or a compound semiconductor such as silicon carbide (SiC), gallium arsenide (GaAs), indium arsenide (InAs), or indium phosphide (InP). The semiconductor substrate 110 may include a conductive region, for example, a well doped with impurities or a structure doped with impurities. In addition, the semiconductor substrate 110 may have various device isolation structures such as shallow trench isolation (STI) structures.

The FEOL structure 120 may be arranged on the first surface 111 of the semiconductor substrate 110. The FEOL structure 120 may include a plurality of individual devices and interlayer insulating layers of various types. The plurality of individual devices may include various microelectronic devices, for example, a metal-oxide-semiconductor field effect transistor (MOSFET), a system large scale integration (LSI), an image sensor such as a CMOS imaging sensor (CIS), a micro-electro-mechanical system (MEMS), an active device, and a passive device. The plurality of individual devices may be electrically connected to the conductive region of the semiconductor substrate 110. In addition, each of the plurality of individual devices may be electrically separated from other neighboring individual devices by the interlayer insulating layer.

The BEOL structure 130 may be arranged on the FEOL structure 120. The BEOL structure 130 may include a first conductive connection structure 131, a second conductive connection structure 139, and a plurality of interlayer insulating layers 135 insulating the first conductive connection structure 131 and the second conductive connection structure 139. The plurality of interlayer insulating layers 135 may be mutually stacked in a vertical direction (Z direction) perpendicular to the first surface 111 of the semiconductor substrate 110, and may cover the first conductive connection structure 131 and the second conductive connection structure 139. Each of the first conductive connection structure 131 and the second conductive connection structure 139 may be electrically connected to individual devices provided in the FEOL structure 120.

The first conductive connection structure 131 may have a multi-layer structure. The first conductive connection structure 131 may include a plurality of first conductive layers 131p located at different levels in the vertical direction (Z direction), and a plurality of first conductive vias 131v extending between the plurality of first conductive layers 131p. The plurality of first conductive layers 131p may each extend in a horizontal direction (X direction or Y direction), and the plurality of first conductive vias 131v may each extend in the vertical direction (Z direction). The plurality of first conductive vias 131v may electrically connect two first conductive layers 131p located at different levels in the vertical direction (Z direction). In FIG. 2, it is illustrated that the first conductive connection structure 131 has a three-layer structure. However, inventive concepts are not limited thereto. For example, the first conductive connection structure 131 may have a multi-layer structure including four or more layers.

The second conductive connection structure 139 may include a plurality of second conductive layers 139p located at different levels in the vertical direction (Z direction), and a plurality of second conductive vias 139v extending between the plurality of second conductive layers 139p. Each of the plurality of second conductive layers 139p may be located at the same level as any one of the plurality of first conductive layers 131p. The plurality of second conductive vias 139v may electrically connect two second conductive layers 139p located at different levels in the vertical direction (Z direction).

For example, the first conductive connection structure 131 and the second conductive connection structure 139 may each include a metal such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), or an alloy thereof.

The conductive reinforcing layer 140 may be arranged on the BEOL structure 130. The conductive reinforcing layer 140 may be electrically connected to the first conductive connection structure 131 and may be electrically connected to the plurality of first connection bumps 171. The plurality of first connection bumps 171 may be electrically connected to each other through the conductive reinforcing layer 140, and may be electrically connected to the first conductive connection structure 131 through the conductive reinforcing layer 140.

In some cases, the plurality of first connection bumps 171 may be electrically connected to each other through a connection structure other than the conductive reinforcing layer 140. For example, when the conductive reinforcing layer 140 is composed of a plurality of physically separated parts, the plurality of first connection bumps 171 may be electrically connected to each other through the first conductive connection structure 131 of the BEOL structure 130.

The conductive reinforcing layer 140 may have an area overlapping at least a portion of each of the plurality of first connection bumps 171 in the vertical direction (Z direction). For example, the conductive reinforcing layer 140 may have a plate shape parallel to the first surface 111 of the semiconductor substrate 110 and may have an area overlapping at least a portion of each of the plurality of first connection bumps 171 in the vertical direction (Z direction) perpendicular to the first surface 111 of the semiconductor substrate 110. In other words, the plurality of first connection bumps 171 electrically connected to the conductive reinforcing layer 140 may be located to overlap the conductive reinforcing layer 140 in the vertical direction (Z direction).

In example embodiments, the conductive reinforcing layer 140 may have a larger footprint than the sum of the footprints of the plurality of first connection bumps 171. In example embodiments, in a plan view, a width of the conductive reinforcing layer 140 in the first horizontal direction (X direction) and a width of the conductive reinforcing layer 140 in the second horizontal direction (Y direction) may each be greater than at least 30 micrometers (μm).

The conductive reinforcing layer 140 may include a conductive plate 141 extending along the bottom surface of the BEOL structure 130, and a conductive reinforcing via 143 that physically and electrically connects the conductive plate 141 to a first conductive layer 131p located at the lowermost layer from among the plurality of first conductive layers 131p.

The conductive plate 141 may have a plate shape. For example, the conductive plate 141 may have a plate shape parallel to the first surface 111 of the semiconductor substrate 110. In example embodiments, the thickness of the conductive plate 141 in the vertical direction (Z direction) may be between about 1.4 μm and about 3 μm. The thickness of the conductive plate 141 may be greater than the thickness of each of the first conductive layers 131p in the vertical direction (Z direction).

As shown in FIG. 3, the conductive plate 141 may include a plurality of first bump pads 1411 overlapping the plurality of first connection bumps 171 in the vertical direction, and an extension portion 1413 extending between the plurality of first bump pads 1411. The plurality of first bump pads 1411 may be electrically connected to each other through the extension portion 1413.

For example, the conductive reinforcing layer 140 may have a polygonal shape, such as a quadrangle or a triangle, or a circular shape in a plan view. For example, the conductive reinforcing layer 140 may extend along each of two edges forming a vertex of the bottom surface of the semiconductor chip 100 (or the bottom surface of the interconnect structure 190) and have a bent shape when viewed from above.

A distance between the centers of two adjacent first connection bumps 171 may be defined as a first pitch. When the number of first connection bumps 171 in one row or column parallel to one edge of the bottom surface of the semiconductor chip 100 from among the plurality of first connection bumps 171 is N (where N is an integer), the length of the conductive reinforcing layer 140 extending along the one edge of the bottom surface of the semiconductor chip 100 may be between "first pitch*(N−1)" and "first pitch*N". In example embodiments, the length of the conductive reinforcing layer 140 extending along the one edge of the bottom surface of the semiconductor chip 100 may be between about 90 μm and about 200 μm.

The conductive reinforcing layer 140 may include a metal such as Cu, Al, W, Ti, Ta, In, Mo, Mn, Co, Sn, Ni, Mg, Re, Be, Ga, or Ru, or an alloy thereof.

In example embodiments, the conductive reinforcing layer 140 may include a material different from those of the first conductive connection structure 131 and the first UBM layer 160. For example, the conductive reinforcing layer 140 may include Al, and the first conductive connection structure 131 and the first UBM layer 160 may include Cu.

The pad layer 180 and the conductive reinforcing layer 140 may be arranged on the BEOL structure 130 and be located at the same level as the conductive reinforcing layer 140. The pad layer 180 may be electrically connected to the second conductive connection structure 139, and may electrically connect the second connection bump 173 to the second conductive connection structure 139. The pad layer 180 may include a second bump pad 181 connected to the second connection bump 173 and a conductive via 183 connected to the second bump pad 181. The second bump pad 181 may be located at the same level as the conductive plate 141 of the conductive reinforcing layer 140, and may overlap the second connection bump 173 in the vertical direction. The conductive via 183 may physically and electrically connect the second bump pad 181 to a second conductive layer 139p located at the lowermost layer from among the plurality of second conductive layers 139p. The pad layer 180 may include the same material or material composition as the conductive reinforcing layer 140.

The cover insulating layer 150 may cover the conductive reinforcing layer 140 and the pad layer 180. The conductive reinforcing layer 140 and the pad layer 180 may be buried in the cover insulating layer 150. The cover insulating layer 150 may include a first insulating layer 151 and a second insulating layer 153 stacked in the vertical direction (Z direction). The first insulating layer 151 may be formed on the lower surface of the BEOL structure 130 to cover the conductive reinforcing layer 140 and the pad layer 180, and the second insulating layer 153 may be formed on the lower surface of the first insulating layer 151. For example, the first insulating layer 151 may include oxide and/or nitride. For example, the first insulating layer 151 may include a tetra-ethyl-ortho-silicate (TEOS) oxide layer. For example, the second insulating layer 153 may include a material layer composed of an organic compound, for example, a photo imageable dielectric (PID), an Ajinomoto Build-up Film (ABF), or a photosensitive polyimide (PSPI).

The first UBM layer 160 may be arranged on the conductive reinforcing layer 140 and may include a plurality of pad connection portions 161 to which the plurality of first connection bumps 171 are attached. The plurality of pad connection portions 161 of the first UBM layer 160 may be connected to the plurality of first bump pads 1411 of the conductive plate 141 through first openings of the cover insulating layer 150.

In example embodiments, the plurality of first connection bumps 171, the first UBM layer 160, the conductive reinforcing layer 140, and the first conductive connection structure 131 may be electrically connected to one another. In example embodiments, the plurality of first connection bumps 171 may be configured to receive a ground voltage from an external device, and the plurality of first connection bumps 171, the first UBM layer 160, the conductive reinforcing layer 140, and the first conductive connection structure 131 may be electrically grounded.

The first UBM layer 160 may be a single metal layer, or may be a stacked structure including a plurality of metal layers. For example, the first UBM layer 160 may include a first metal layer, a second metal layer, and a third metal layer sequentially stacked in the vertical direction (Z direction). The first metal layer may act as an adhesive layer for stably attaching to the first bump pad 1411 of the conductive plate 141 and the cover insulating layer 150. The first metal layer may include a metal material having excellent adhesion properties to the cover insulating layer 150. For example, the first metal layer may include at least one material selected from Ti, Ti—W, and chromium (Cr). The second metal layer may be a seed layer for forming a third metal layer. The second metal layer may include, for example, at least one material selected from Ni and Cu. The third metal layer is a plating layer formed using the second metal layer as a seed, and may include Cu.

The second UBM layer 165 may be arranged on the pad layer 180. The second UBM layer 165 may be connected to the pad layer 180 through second openings of the cover insulating layer 150. The second UBM layer 165 may include the same material or material composition as the first UBM layer 160.

In example embodiments, the height of the first UBM layer 160 in the vertical direction (Z direction) and the height of the second UBL layer 165 in the vertical direction (Z direction), which are measured with respect to the lower surface of the cover insulating layer 150, may be between about 3 μm and about 6 μm.

Figure 4:
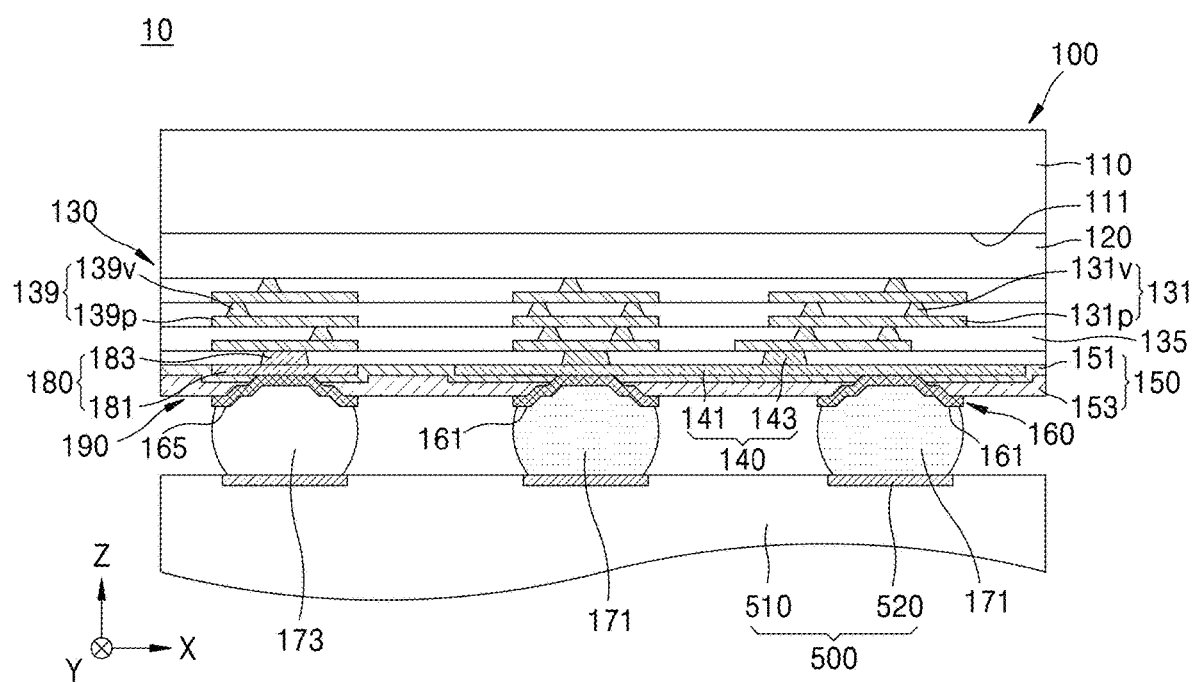
FIG. 4 is a cross-sectional view of a portion of a semiconductor package according to example embodiments.

FIG. 4 is a cross-sectional view of a portion of a semiconductor package 10 according to example embodiments.

Referring to FIGS. 1 to 4, the semiconductor package 10 may include a package substrate 500 and a semiconductor chip 100 mounted on the package substrate 500. For example, the semiconductor chip 100 may be mounted on the package substrate 500 in a flip chip method.

The package substrate 500 may be, for example, a printed circuit board. For example, the package substrate 500 may be a multi-layer printed circuit board. The package substrate 500 may include a substrate base 510 and substrate pads 520 arranged on a surface of the substrate base 510. The substrate base 510 may include at least one material selected from phenol resin, epoxy resin, and polyimide. First connection bumps 171 and second connection bumps 173 of the semiconductor chip 100 may be attached on the substrate pads 520, and the semiconductor chip 100 may be electrically connected to circuit patterns of the package substrate 500 through the first connection bumps 171 and the second connection bumps 173.

In general, the corner regions 105 of the bottom surface of the semiconductor chip 100 are areas where stress is concentrated, and a relatively large stress acts on bumps arranged in the corner regions 105 of the bottom surface of the semiconductor chip 100 and a conductive structure connected to the bumps. In the vicinity of the corner regions 105 of the bottom surface of the semiconductor chip 100, the stress causes damage to the bumps, generates cracks in the BEOL structure 130, and causes separation between a conductive layer and an interlayer insulating layer 135 in the BEOL structure 130.

However, according to example embodiments, because the plurality of first connection bumps 171 arranged on the corner regions 105 of the bottom surface of the semiconductor chip 100 are connected to the conductive reinforcing layer 140 having a plate shape, the stress acting in the vicinity of the corner regions 105 of the bottom surface of the semiconductor chip 100 may be dispersed by the conductive reinforcing layer 140 having a large area. Because the stress acting on the corner regions 105 of the semiconductor chip 100 may be dispersed and relieved, damage caused by the stress in the semiconductor chip 100 may be reduced, and reliability of an electrical connection between the semiconductor chip 100 and the package substrate 500 may be improved.

Figure 5:
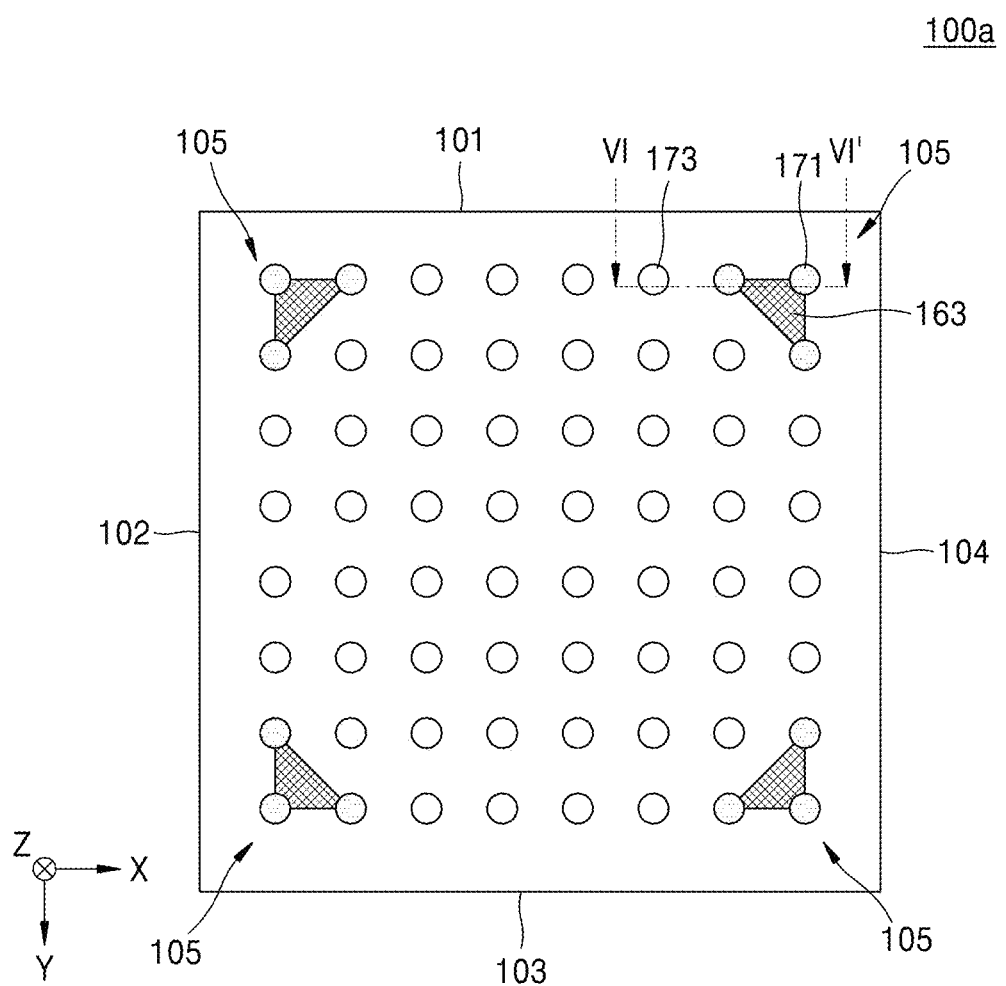
FIG. 5 is a bottom view illustrating a bottom surface of a semiconductor chip according to example embodiments.
Figure 6:
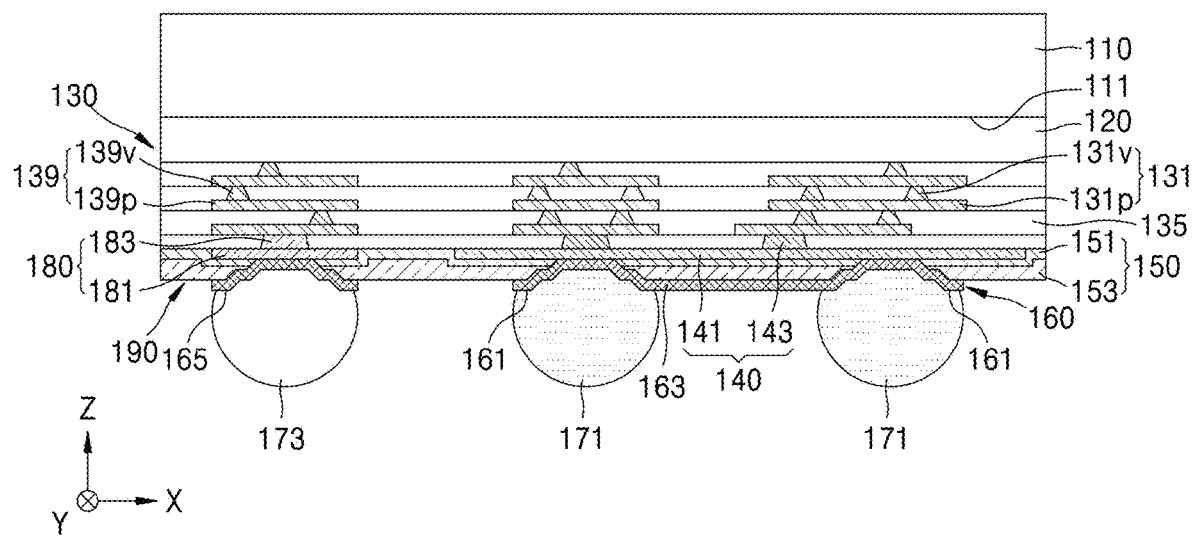
FIG. 6 is a cross-sectional view of the semiconductor chip taken along line VI-VI' of FIG. 5.

FIG. 5 is a bottom view illustrating a bottom surface of a semiconductor chip 100a according to example embodiments. FIG. 6 is a cross-sectional view of the semiconductor chip 100a taken along line VI-VI' of FIG. 5. Hereinafter, a difference from the semiconductor chip 100 described with reference to FIGS. 1 to 3 will be mainly described.

Referring to FIGS. 5 and 6, a first UBM layer 160 may include a plurality of pad connection portions 161 to which a plurality of first connection bumps 171 are attached, and a bridge portion 163 connecting the plurality of pad connection portions 161. The bridge portion 163 may extend between the plurality of pad connection portions 161 to be connected to each of the plurality of pad connection portions 161, and thus, the plurality of pad connection portions 161 may be electrically and physically connected to one another. The bridge portion 163 may have a plate shape extending along the lower surface of the cover insulating layer 150.

Because the plurality of pad connection portions 161 are electrically connected by the bridge portion 163, the plurality of first connection bumps 171 may be electrically connected to one another through the first UBM layer 160. The bridge portion 163 is formed together with the plurality of pad connection portions 161 when the plurality of pad connection portions 161 are formed, and may include the same material or material composition as the plurality of pad connection portions 161.

The first UBM layer 160 may have an area overlapping at least a portion of each of the plurality of first connection bumps 171 in the vertical direction (Z direction). For example, in a plan view, the first UBM layer 160 may be in the form of a plate having an area overlapping at least a portion of each of the plurality of first connection bumps 171 in the vertical direction (Z direction). For example, a width of the first UBM layer 160 in the first horizontal direction (X direction) and a width of the first UBM layer 160 in the second horizontal direction (Y direction) may each be greater than at least 30 μm.

The first UBM layer 160 may be formed to have a relatively large area, and thus may disperse stress acting in the vicinity of corner regions (see 105 in FIG. 1) of the bottom surface of the semiconductor chip 100a together with a conductive reinforcing layer 140. Accordingly, damage due to stress in the semiconductor chip 100a may be reduced, and reliability of an electrical connection between the semiconductor chip 100a and a package substrate may be improved.

Figure 7:
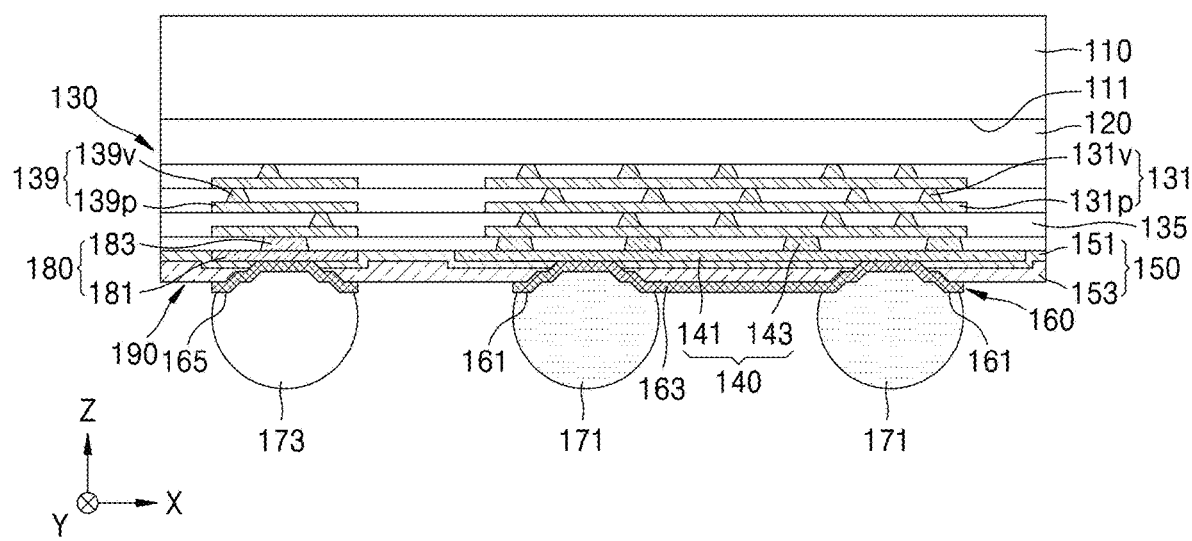
FIG. 7 is a cross-sectional view of a portion of a semiconductor chip according to example embodiments.

FIG. 7 is a cross-sectional view of a portion of a semiconductor chip 100b according to example embodiments. In FIG. 7, a cross-section of the semiconductor chip 100b corresponding to the cross-section taken along line VI-VI' of FIG. 5 is shown. Hereinafter, a difference from the semiconductor chip 100a described with reference to FIGS. 5 and 6 will be mainly described.

Referring to FIG. 7, at least some of a plurality of first conductive layers 131p in a first conductive connection structure 131 may have plate shapes. For example, at least some of the plurality of first conductive layers 131p may each have an area overlapping at least a portion of each of the plurality of first connection bumps 171 in the vertical direction (Z direction). For example, widths of at least some of the plurality of first conductive layers 131p in the first horizontal direction (X direction) and widths of the at least some in the second horizontal direction (Y direction) may be greater than at least 30 μm. Because at least some of the plurality of first conductive layers 131p are formed to have relatively large areas, the first conductive connection structure 131 may disperse stress acting in the vicinity of corner regions (see 105 in FIG. 1) of the bottom surface of the semiconductor chip 100b together with a first UBM layer 160 and a conductive reinforcing layer 140. Accordingly, damage due to stress in the semiconductor chip 100b may be reduced, and reliability of an electrical connection between the semiconductor chip 100b and a package substrate may be improved.

Also, a plurality of first conductive vias 131v may be arranged in a two-dimensional array shape on at least one first conductive layer 131p having a plate shape. That is, the plurality of first conductive vias 131v may be arranged in two or more rows and two or more columns on the surface of at least one first conductive layer 131p having a plate shape.

In example embodiments, the pitch of the plurality of first conductive vias 131v arranged on the at least one first conductive layer 131p (e.g., a distance between the centers of two adjacent first conductive vias 131v) may be between about 0.5 μm and about 3 μm. The pitch of the plurality of first conductive vias 131v may be less than the pitch of the plurality of second conductive vias 139v (e.g., a distance between the centers of two adjacent second conductive vias 139v). Because the first conductive layers 131p may be rigidly connected through the plurality of first conductive vias 131v arranged at narrow intervals, a stress dispersing effect due to the first conductive connection structure 131 may be improved.

Furthermore, conductive reinforcing vias 143 of the conductive reinforcing layer 140 may be arranged in a two-dimensional array form on a plate-shaped conductive plate 141. For example, the pitch of the conductive reinforcing vias 143 of the conductive reinforcing layer 140 may be between about 0.5 μm and about 3 μm. Because the first conductive connection structure 131 and the conductive reinforcing layer 140 may be rigidly connected through the conductive reinforcing vias 143 arranged at narrow intervals, a stress dispersing effect due to the conductive reinforcing layer 140 and the first conductive connection structure 131 may be improved.

Figure 8:
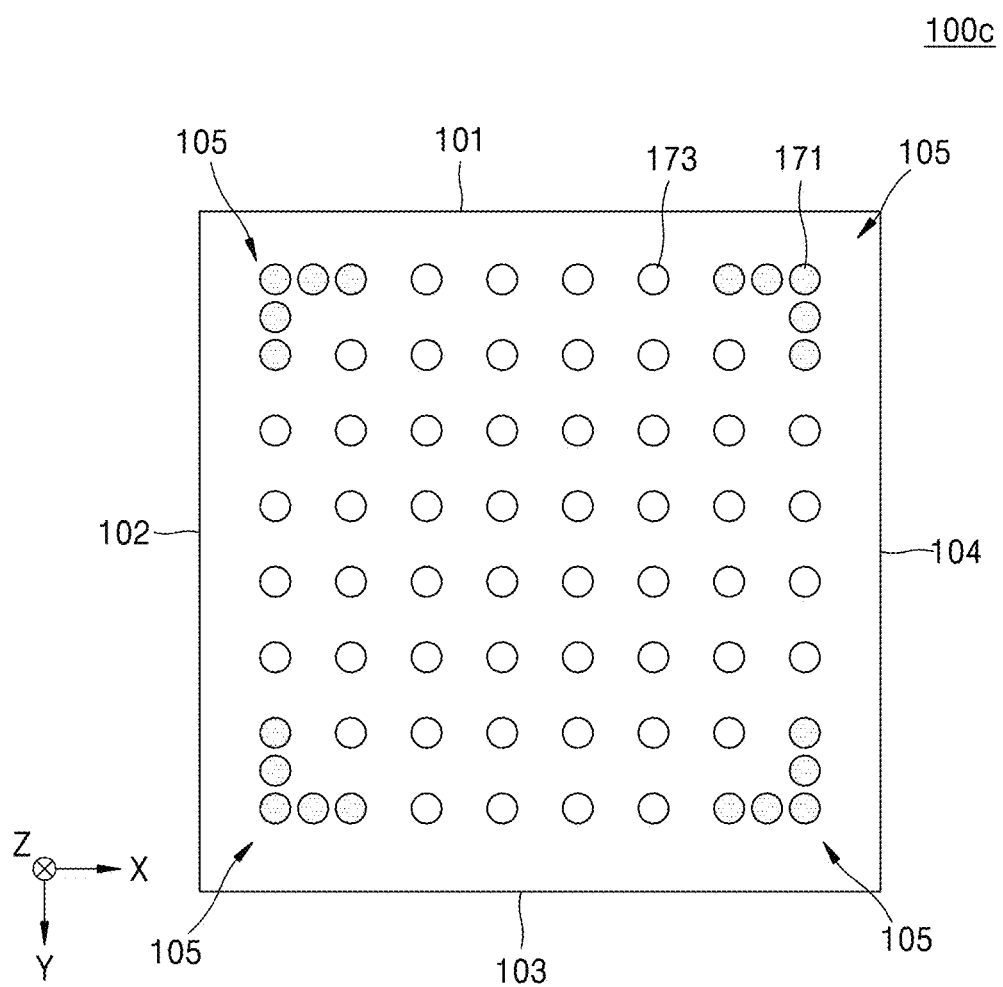
FIG. 8 is a cross-sectional view of a portion of a semiconductor chip according to example embodiments.

FIG. 8 is a cross-sectional view of a portion of a semiconductor chip 100c according to example embodiments. Hereinafter, a difference from the semiconductor chip 100 described with reference to FIGS. 1 to 3 will be mainly described.

Referring to FIG. 8, a first pitch, which is a distance between the centers of neighboring first connection bumps 171, may be less than a second pitch, which is a distance between the centers of neighboring second connection bumps 173. Because stress acting on corner regions 105 of the semiconductor chip 100c is dispersed by the first connection bumps 171 densely arranged at relatively narrow intervals, damage to the semiconductor chip 100c due to stress concentration may be reduced.

In example embodiments, a plurality of first connection bumps 171 may be physically coupled to each other to form one body. Because the plurality of first connection bumps 171 are terminals configured to be electrically connected to one another, even though the first connection bumps 171 are physically coupled to each other, the operation of the semiconductor chip 100c is not affected. When the plurality of first connection bumps 171 are coupled to each other to form a single body, the stress acting in the vicinity of the corner regions (see 105 in FIG. 1) of the bottom surface of the semiconductor chip 100b may be dispersed more effectively.

In example embodiments, in order to form a structure in which the plurality of first connection bumps 171 are coupled to each other, a plurality of pad connection portions (see 161 in FIG. 2) of a first UBM layer (see 160 in FIG. 2) may be spaced apart from each other by a distance similar to the diameters of the first connection bumps 171, and the first pitch between the plurality of first connection bumps 171 attached on the plurality of pad connection portions 161 may also have a level similar to the diameters of the first connection bumps 171. Because the plurality of first connection bumps 171 are arranged adjacent to each other, conductors forming the plurality of first connection bumps 171 may be coupled to each other in a reflow process.

Figure 9:
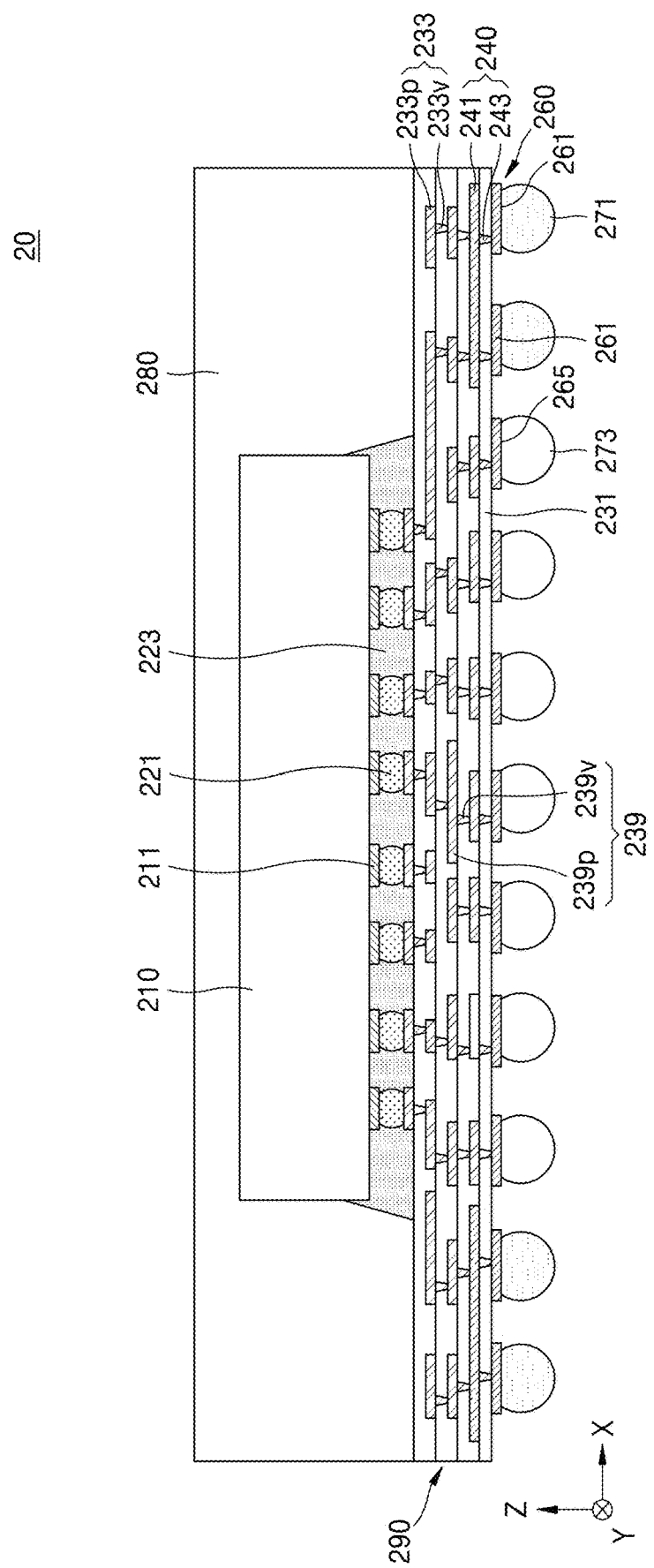
FIG. 9 is a cross-sectional view of a semiconductor package according to example embodiments.

FIG. 9 is a cross-sectional view of a semiconductor package 20 according to example embodiments.

Referring to FIG. 9, the semiconductor package 20 may include a plurality of first connection bumps 271, a plurality of second connection bumps 273, an interconnect structure 290, a semiconductor chip 210, and a molding layer 280.

The plurality of first connection bumps 271, the plurality of second connection bumps 273, and the interconnect structure 290 may be substantially the same as or similar to the plurality of first connection bumps 171, the plurality of second connection bumps 173, and the interconnect structure 190, respectively, of each of the semiconductor chips 100, 100a, 100b, and 100c described above with reference to FIGS. 1 to 8. Hereinafter, with respect to the plurality of first connection bumps 271, the plurality of second connection bumps 273, and the interconnect structure 290, descriptions which are the same as already given above will be omitted or simplified.

The plurality of first connection bumps 271 and the plurality of second connection bumps 273 may be arranged in a two-dimensional array form on the bottom surface of the semiconductor package 20 (or the bottom surface of the interconnect structure 290). The plurality of first connection bumps 271 may be terminals arranged in corner regions of the bottom surface of the semiconductor package 20, and the plurality of second connection bumps 273 may be terminals other than the plurality of first connection bumps 271. The plurality of first connection bumps 271 may be electrically connected to one another and may perform the same function. For example, the plurality of first connection bumps 271 may be terminals that are electrically grounded by receiving a ground voltage from an external device. The plurality of second connection bumps 273 may include terminals configured to receive a data input/output signal, a driving voltage, and/or a ground voltage from an external device.

The interconnect structure 290 may include a first conductive connection structure 233, a second conductive connection structure 239, a conductive reinforcing layer 240, a first UBM layer 260, a second UBM layer 265, and a plurality of redistribution insulating layers 231.

The plurality of redistribution insulating layers 231 may be stacked together in the vertical direction (Z direction). The plurality of redistribution insulating layers 231 may each include a material layer composed an organic compound. For example, the plurality of redistribution insulating layers 231 may each include PID, ABF, or PSPI.

The first conductive connection structure 233 may include a first conductive layer 233p extending along surfaces of at least some of the plurality of redistribution insulating layers 231, and a first conductive via 233v extending through at least some of the plurality of redistribution insulating layers 231. In example embodiments, the first conductive connection structure 233 may have a multi-layer structure including two or more first conductive layers 233p located at different levels in the vertical direction (Z direction). The first conductive connection structure 233 may be electrically connected to the plurality of first connection bumps 271, and may be electrically connected to the semiconductor chip 210.

The second conductive connection structure 239 may include a second conductive layer 239p extending along surfaces of at least some of the plurality of redistribution insulating layers 231, and a second conductive via 239v extending through at least some of the plurality of redistribution insulating layers 231. The second conductive connection structure 239 may be electrically connected to the plurality of second connection bumps 273, and may be electrically connected to the semiconductor chip 210.

The conductive reinforcing layer 240 may be connected to the first conductive connection structure 233. The conductive reinforcing layer 240 may have an area overlapping at least a portion of each of the plurality of first connection bumps 271 in the vertical direction (Z direction). For example, the conductive reinforcing layer 240 may be in the form of a plate having an area overlapping at least a portion of each of the plurality of first connection bumps 271 in the vertical direction (Z direction).

For example, the conductive reinforcing layer 240 may include a conductive plate 241 extending along the upper surface of a redistribution insulating layer 231 located at the lowermost layer from among the plurality of redistribution insulating layers 231, and a conductive reinforcing via 243 extending through the redistribution insulating layer 231 located at the lowermost layer from among the plurality of redistribution insulating layers 231.

The first UBM layer 260 may be arranged on the conductive reinforcing layer 240 and may be electrically connected to the conductive reinforcing layer 240. The first UBM layer 260 may include a plurality of pad connection portions 261 to which the plurality of first connection bumps 271 are attached.

In example embodiments, the plurality of first connection bumps 271, the first UBM layer 260, the conductive reinforcing layer 240, and the first conductive connection structure 233 may be electrically connected to one another. In example embodiments, the plurality of first connection bumps 271 may be configured to receive a ground voltage from an external device. In this case, the plurality of first connection bumps 271, the first UBM layer 260, the conductive reinforcing layer 240, and the first conductive connection structure 233 may be electrically grounded.

The second UBM layer 265 may be electrically connected to the second conductive connection structure 239. A second connection bump 273 may be attached to the second UBM layer 265.

The semiconductor chip 210 may be arranged on the upper surface of the interconnect structure 290. For example, a chip connection bump 221 may be attached on a pad 211 provided on the lower surface of the semiconductor chip 210, and the semiconductor chip 210 may be mounted on the interconnect structure 290 through the chip connection bump 221 in a flip chip method. In some example embodiments, the semiconductor chip 210 may correspond to any one of the semiconductor chips 100, 100a, 100b, and 100c described with reference to FIGS. 1 to 8.

In addition, although it is illustrated in FIG. 9 that the semiconductor package 20 includes one semiconductor chip 210, inventive concepts are not limited thereto. For example, two or more semiconductor chips 210 spaced apart from each other in a horizontal direction may be arranged on the interconnect structure 290. The two or more semiconductor chips 210 may be of the same type or different types of chips.

In example embodiments, an under-fill material layer 223 surrounding the chip connection bump 221 may be arranged between the semiconductor chip 210 and the interconnect structure 290. The under-fill material layer 223 may include, for example, an epoxy resin formed by a capillary under-fill method. However, in some example embodiments, the molding layer 280 may be directly filled into a gap between the semiconductor chip 210 and the interconnect structure 290 through a molded under-fill process. In this case, the under-fill material layer 223 may be omitted.

The molding layer 280 may be arranged on the interconnect structure 290 to cover at least a portion of the semiconductor chip 210. For example, the molding layer 280 may cover a sidewall of the semiconductor chip 210 and an upper surface of the semiconductor chip 210. In some example embodiments, the molding layer 280 may cover the sidewall of the semiconductor chip 210, but may not cover the upper surface of the semiconductor chip 210 so that the upper surface of the semiconductor chip 210 is exposed. In example embodiments, the molding layer 280 may include an insulating polymer or an epoxy resin. For example, the molding layer 280 may include an epoxy mold compound (EMC).

The semiconductor package 20 may be a wafer level package. For example, the semiconductor package 20 may be a fan-out semiconductor package in which a footprint of the interconnect structure 290 is larger than that of the semiconductor chip 210. In some example embodiments, the semiconductor package 20 may be a fan-in semiconductor package in which the footprint of the interconnect structure 290 is the same as that of the semiconductor chip 210.

In example embodiments, the semiconductor package 20 may be manufactured through a chip last fan-out process, in which forming the interconnect structure 290, mounting the semiconductor chip 210 on the interconnect structure 290, and forming the molding layer 280 are sequentially performed. In this case, the first conductive via 233v of the first conductive connection structure 233, the second conductive via 239v of the second conductive connection structure 239, and the conductive reinforcing via 243 of the conductive reinforcing layer 240 may each have a tapered shape with a horizontal width narrowing in a direction from an upper side to a lower side thereof, the tapered shape extending in the direction. That is, the first conductive via 233v of the first conductive connection structure 233, the second conductive via 239v of the second conductive connection structure 239, and the conductive reinforcing via 243 of the conductive reinforcing layer 240 may each have a shape with a horizontal width becoming narrower in a direction away from the upper surface of the interconnect structure 290.

In addition, the semiconductor package 20 may be manufactured by an UBM last method in which, in the forming of the interconnect structure 290, the conductive reinforcing layer 240, the first conductive connection structure 233, and the second conductive connection structure 239 are formed through a redistribution process and then the first UBM layer 260 and the second UBM layer 265 are formed last. In this case, the first UBM layer 260 and the second UBM layer 265 may be formed on a flat surface of a redistribution insulating layer 231 located at the lowermost layer from among the plurality of redistribution insulating layers 231, and thus may have uniform thicknesses as a whole. The lower surface of the first UBM layer 260 to which the first connection bump 271 is attached and the lower surface of the second UBM layer 265 to which the second connection bump 273 is attached may each have a flat shape.

According to example embodiments, because the plurality of first connection bumps 271 arranged on corner regions of the bottom surface of the semiconductor package 20 are connected to the conductive reinforcing layer 240 having a plate shape, stress acting in the vicinity of the corner regions of the bottom surface of the semiconductor package 20 may be dispersed by the conductive reinforcing layer 240 having a large area. Because the stress acting on the corner regions of the semiconductor package 20 may be dispersed and relieved, damage caused by the stress in the semiconductor package 20 may be reduced, and reliability of an electrical connection between the semiconductor package 20 and a board substrate on which the semiconductor package 20 is mounted may be improved.

Figure 10:
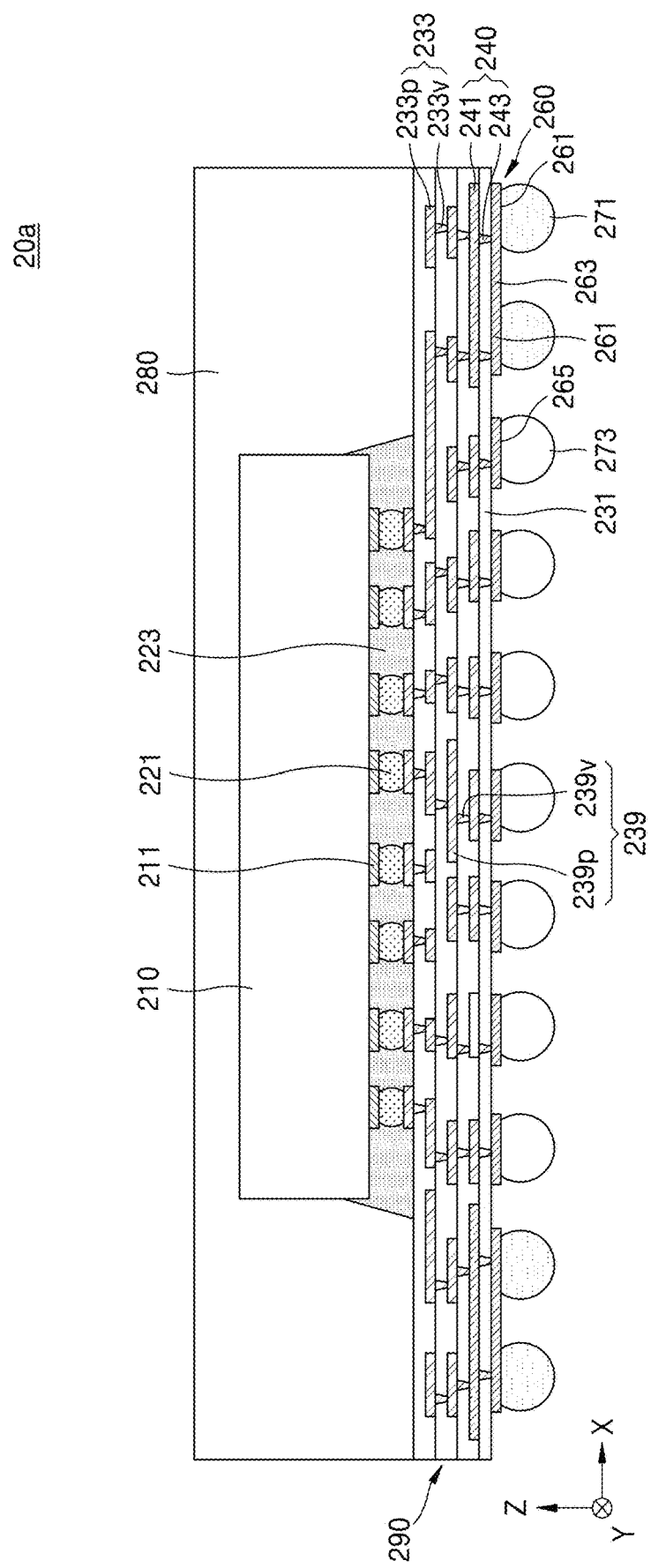
FIG. 10 is a cross-sectional view of a semiconductor package according to example embodiments.

FIG. 10 is a cross-sectional view of a semiconductor package 20a according to example embodiments. Hereinafter, a description will be made focusing on differences from the semiconductor package 20 described with reference to FIG. 9.

Referring to FIG. 10, the first UBM layer 260 may include a plurality of pad connection portions 261 to which a plurality of first connection bumps 271 are attached, and a bridge portion 263 connecting the plurality of pad connection portions 261. Because the plurality of pad connection portions 261 are electrically connected by the bridge portion 263, the plurality of first connection bumps 271 may be electrically connected to one another through the first UBM layer 260. The bridge portion 263 may have a plate shape, and may have an area overlapping at least a portion of each of the plurality of pad connection portions 261.

The first UBM layer 260 may be formed to have a relatively large area, and thus may disperse stress acting in the vicinity of corner regions of the bottom surface of the semiconductor package 20a together with a conductive reinforcing layer 240. Accordingly, damage due to stress in the semiconductor package 20a may be reduced, and reliability of an electrical connection between the semiconductor package 20a and a board substrate may be improved.

Figure 11:
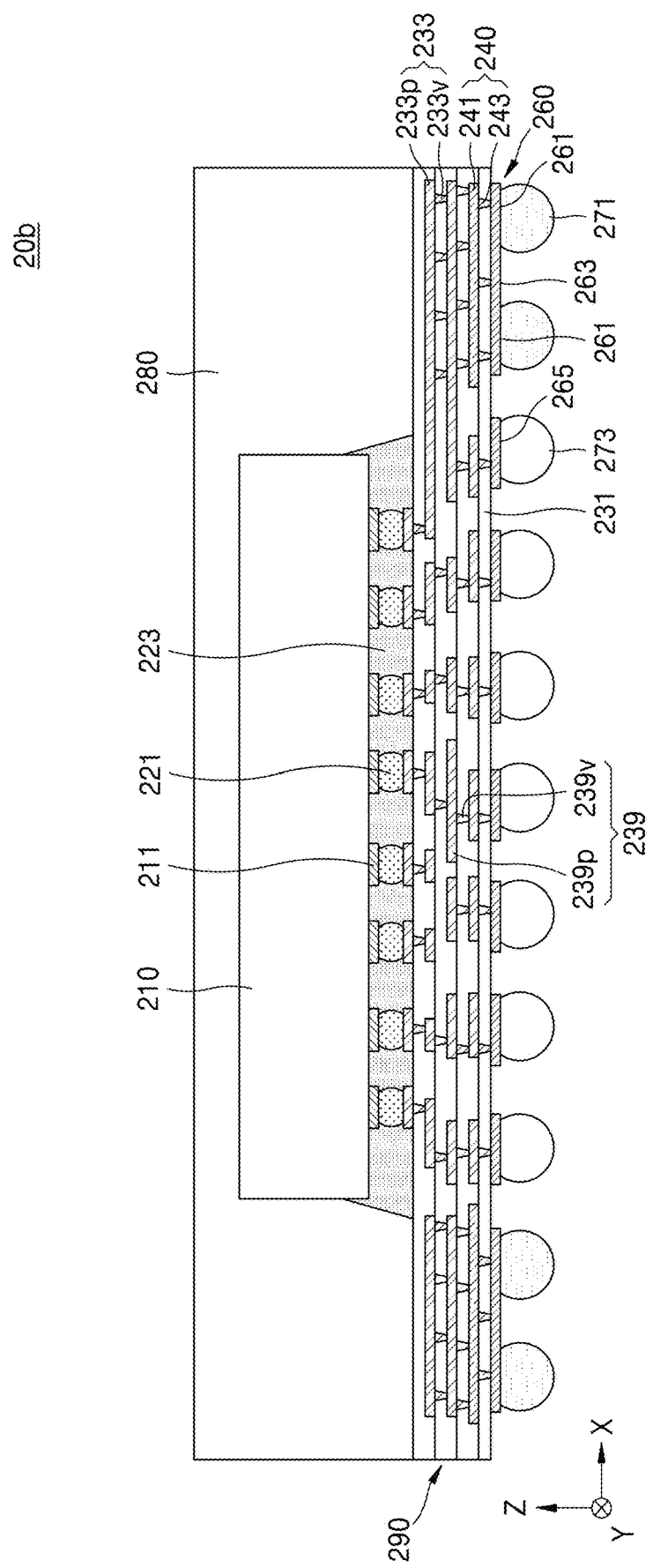
FIG. 11 is a cross-sectional view of a semiconductor package according to example embodiments.

FIG. 11 is a cross-sectional view of a semiconductor package 20b according to example embodiments. Hereinafter, a description will be made focusing on differences from the semiconductor package 20a described with reference to FIG. 10.

Referring to FIG. 11, at least some of a plurality of first conductive layers 233p in a first conductive connection structure 233 may have plate shapes. For example, at least some of the plurality of first conductive layers 233p may each have an area overlapping at least a portion of each of the plurality of first connection bumps 271 in the vertical direction (Z direction).

Because at least some of the plurality of first conductive layers 233p are formed to have relatively large areas, the first conductive connection structure 233 may disperse stress acting in the vicinity of corner regions of the bottom surface of the semiconductor package 20b together with a first UBM layer 260 and a conductive reinforcing layer 240. Accordingly, damage due to stress in the semiconductor package 20b may be reduced, and reliability of an electrical connection between the semiconductor package 20b and a board substrate may be improved.

Also, a plurality of first conductive vias 233v may be arranged in a two-dimensional array shape on at least one first conductive layer 233p having a plate shape. For example, the plurality of first conductive vias 233v may be arranged in two or more rows and two or more columns on the surface of at least one first conductive layer 233p having a plate shape. Because the first conductive layers 233p located at different levels may be rigidly connected through the plurality of first conductive vias 233v arranged at narrow intervals and a lowermost conductive layer and the conductive reinforcing layer 240 may also be rigidly connected through the plurality of first conductive vias 233v, a stress dispersing effect due to the conductive reinforcing layer 240 and the first conductive connection structure 233 may be improved.

Furthermore, conductive reinforcing vias 243 of the conductive reinforcing layer 240 may be arranged in a two-dimensional array form on a plate-shaped conductive plate 241. Because the first conductive connection structure 233 and the first UBM layer 260 may be rigidly connected through the conductive reinforcing vias 243 arranged at narrow intervals, a stress dispersing effect due to the conductive reinforcing layer 240 and the first UBM layer 260 may be improved.

Figure 12:
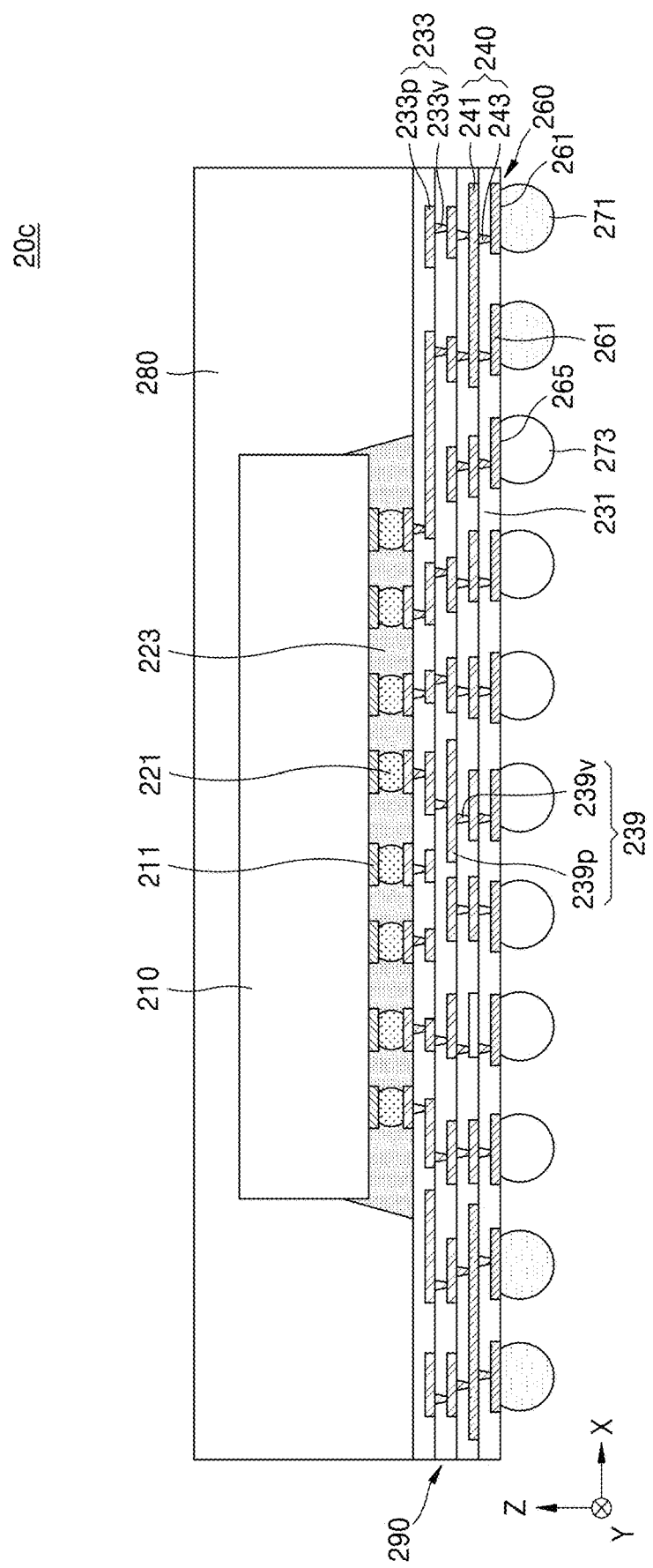
FIG. 12 is a cross-sectional view of a semiconductor package according to example embodiments.

FIG. 12 is a cross-sectional view of a semiconductor package 20c according to example embodiments. Hereinafter, a description will be made focusing on differences from the semiconductor package 20 described with reference to FIG. 9.

Referring to FIG. 12, the semiconductor package 20c may be manufactured through a chip last fan-out process, but may be manufactured by an UBM first method in which, in the forming of an interconnect structure 290, a first UBM layer 260 and a second UBM layer 265 are first formed and then a conductive reinforcing layer 240, a first conductive connection structure 233, and a second conductive connection structure 239 are formed.

In this case, the first UBM layer 260 and the second UBM layer 265 may be formed to have uniform thicknesses as a whole, and the lower surface of the first UBM layer 260 to which a first connection bump 271 is attached, and the lower surface of the second UBM layer 265 to which a second connection bump 273 is attached may each have a flat shape. In addition, at least a portion of the sidewall of the first UBM layer 260 and at least a portion of the sidewall of the second UBM layer 265 may be covered by a redistribution insulating layer 231.

Figure 13:
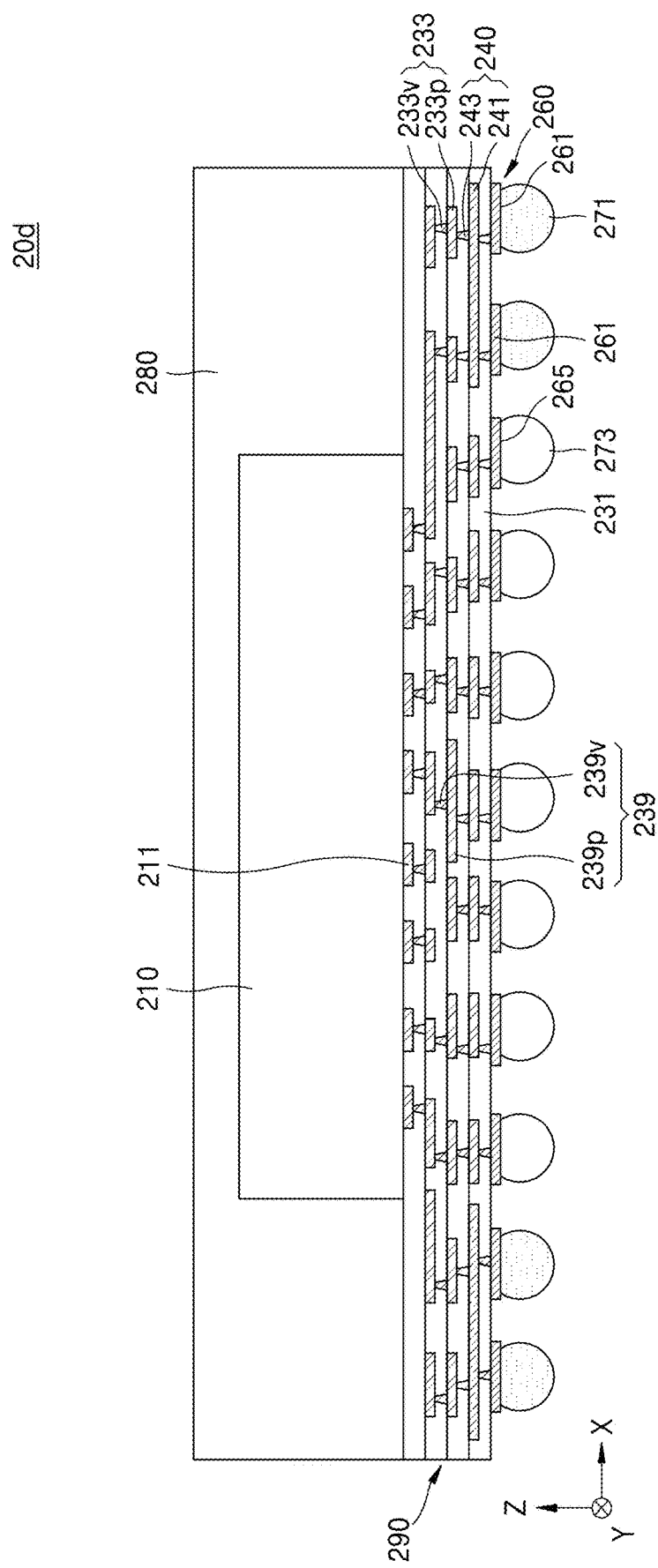
FIG. 13 is a cross-sectional view of a semiconductor package according to example embodiments.

FIG. 13 is a cross-sectional view of a semiconductor package 20d according to example embodiments. Hereinafter, a description will be given focusing on differences from the semiconductor package 20 described with reference to FIG. 9.

Referring to FIG. 13, the semiconductor package 20d may be manufactured through a chip first fan-out process in which forming a molding layer 280 for molding a semiconductor chip 210 and forming an interconnect structure 290 on the semiconductor chip 210 molded by the molding layer 280 are sequentially performed. In this case, a first conductive via 233v of a first conductive connection structure 233, a second conductive via 239v of a second conductive connection structure 239, and a conductive reinforcing via 243 of a conductive reinforcing layer 240 may each have a tapered shape with a horizontal width narrowing in a direction from a lower side to an upper side thereof, the tapered shape extending in the direction. That is, the first conductive via 233v of the first conductive connection structure 233, the second conductive via 239v of the second conductive connection structure 239, and the conductive reinforcing via 243 of the conductive reinforcing layer 240 may each have a shape with a horizontal width becoming narrower while approaching the upper surface of the interconnect structure 290.

While inventive concepts has been particularly shown and described with reference to embodiments thereof, it will be understood that various changes in form and details may be made therein without departing from the spirit and scope of the following claims.

What is claimed is:

1. A semiconductor chip comprising:
 a semiconductor substrate;
 a back end of line (BEOL) structure on a first surface of the semiconductor substrate, the BEOL structure including a conductive connection structure and an interlayer insulating layer covering the conductive connection structure;
 a conductive reinforcing layer on the BEOL structure, the conductive reinforcing layer being electrically connected to the conductive connection structure and having a plate shape extending parallel to the first surface of the semiconductor substrate;
 a cover insulating layer covering the conductive reinforcing layer;
 an under bump metal (UBM) layer including a plurality of pad connection portions connected to the conductive reinforcing layer through openings in the cover insulating layer; and
 a plurality of first connection bumps on the plurality of pad connection portions of the UBM layer, the plurality of first connection bumps being spaced apart from each other,
 the plurality of first connection bumps being electrically connected to one another through the conductive reinforcing layer such that the plurality of first connection bumps are electrically connected to the conductive connection structure of the BEOL structure through the conductive reinforcing layer, and overlapping the conductive reinforcing layer in a direction perpendicular to the first surface of the semiconductor substrate,
 wherein a material of the conductive reinforcing layer is different than a material of the UBM layer and a material of the conductive connection structure of the BEOL structure.

2. The semiconductor chip of claim 1, wherein
 the UBM layer further includes a bridge portion extending between the plurality of pad connection portions, and
 the bridge portion physically and electrically connects the plurality of pad connection portions to each other.

3. The semiconductor chip of claim 1, wherein the conductive reinforcing layer includes aluminum, and the UBM layer includes copper.

4. The semiconductor chip of claim 1, wherein the conductive connection structure of the BEOL structure includes:
 a plurality of conductive layers located at different levels; and
 a plurality of conductive vias extending between the plurality of conductive layers.

5. The semiconductor chip of claim 4, wherein at least one of the plurality of conductive layers has a plate shape parallel to the first surface of the semiconductor substrate.

6. The semiconductor chip of claim 5, wherein the plurality of conductive vias are arranged in a two-dimensional array on a surface of the at least one of the plurality of conductive layers having the plate shape.

7. The semiconductor chip of claim 1, wherein the UBM layer, the conductive reinforcing layer, and the conductive connection structure are electrically grounded.

8. The semiconductor chip of claim 1, wherein
 the plurality of first connection bumps are arranged on a bottom surface of the semiconductor chip, and
 the plurality of first connection bumps are on corner regions of the bottom surface of the semiconductor chip, and
 each corresponding corner region, among the corner regions, is a triangular area defined by a corresponding one of vertices where a first edge of the bottom surface of the semiconductor chip and a second edge of the bottom surface of the semiconductor chip meet, a first location along the first edge of the bottom surface of the semiconductor chip that is a first distance from the corresponding one of the vertices, a second location along the second edge of the bottom surface of the semiconductor chip that is a second distance from the corresponding one of the vertices, and a line overlapping two of the plurality of first connection bumps, provided the line extends from the first location along the first edge of the bottom surface of the semiconductor chip to the second location along the second edge of the bottom surface of the semiconductor chip.

9. The semiconductor chip of claim 8, further comprising:
a plurality of second connection bumps on the bottom surface of the semiconductor chip, wherein
an interval between the plurality of first connection bumps is less than an interval between the plurality of second connection bumps.

10. The semiconductor chip of claim 8, wherein a length of the conductive reinforcing layer extending in a direction parallel to one edge of the bottom surface of the semiconductor chip is between about 90 μm and about 200 μm.

11. An interconnect structure comprising:
an under bump metal (UBM) layer including a plurality of pad connection portions;
a plurality of connection bumps attached to the plurality of pad connection portions, the plurality of connection bumps being spaced apart from each other;
a conductive reinforcing layer; and
a back end of line (BEOL) structure on the conductive reinforcing layer, the BEOL structure including a conductive connection structure and an interlayer insulating layer covering the conductive connection structure, wherein
the conductive reinforcing layer electrically connects the plurality of connection bumps to one another, the conductive reinforcing layer electrically connects the plurality of connection bumps, through the UBM layer, to the conductive connection structure of the BEOL structure, the conductive reinforcing layer having has a plate shape with an area overlapping at least a portion of each of the plurality of connection bumps, and
a material of the conductive reinforcing layer is different layer is different than a material of the UBM layer and a material of the conductive connection structure of the BEOL structure.

12. The interconnect structure of claim 11, further comprising:
a cover insulating layer covering the conductive reinforcing layer,
wherein the plurality of pad connection portions of the UBM layer are connected to the conductive reinforcing layer through openings in the cover insulating layer.

13. The interconnect structure of claim 12, wherein
the UBM layer further includes a bridge portion extending along a surface of the cover insulating layer, and
the bridge portion physically and electrically connects the plurality of pad connection portions to each other.

14. The interconnect structure of claim 11, wherein
the BEOL structure includes a plurality of conductive layers and a plurality of conductive vias,
the plurality of conductive layers are located at different levels,
the plurality of conductive vias extend between the plurality of conductive layers, and
at least one of the plurality of conductive layers has a plate shape.

15. The interconnect structure of claim 14, wherein the plurality of connection bumps, the UBM layer, the conductive reinforcing layer, and the BEOL structure are electrically grounded.

16. A semiconductor chip comprising:
a semiconductor substrate;
a back end of line (BEOL) structure on a first surface of the semiconductor substrate, the BEOL structure including a first conductive connection structure, a second conductive connection structure, and an interlayer insulating layer covering the first conductive connection structure and the second conductive connection structure;
a conductive reinforcing layer arranged on the BEOL structure,
the conductive reinforcing layer being electrically connected to the first conductive connection structure and having a plate shape extending parallel to the first surface of the semiconductor substrate;
a pad layer on the BEOL structure and electrically connected to the second conductive connection structure;
a cover insulating layer covering the conductive reinforcing layer and the pad layer;
a first under bump metal (UBM) layer including a plurality of pad connection portions connected to the conductive reinforcing layer through first openings in the cover insulating layer;
a second UBM layer connected to the pad layer through second openings in the cover insulating layer;
a plurality of first connection bumps on the plurality of pad connection portions of the first UBM layer, the plurality of first connection bumps being electrically connected to the conductive reinforcing layer, the plurality of first connection bumps being spaced apart from each other,
the plurality of first connection, bumps being electrically connected to one another through the conductive reinforcing layer such that the plurality of first connection bumps are electrically connected to the first conductive connection structure of the BEOL structure through the conductive reinforcing layer,
the plurality of first connection bumps, the first UBM layer, the conductive reinforcing layer, and the first conductive connection structure being electrically connected to one another; and
a second connection bump on the second UBM layer,
wherein a material of the conductive reinforcing layer is different than a material of the first UBM layer and a material of the first conductive connection structure of the BEOL structure.

17. The semiconductor chip of claim 16, wherein
the plurality of first connection bumps are arranged on a bottom surface of the semiconductor chip,
the bottom surface of the semiconductor chip has a quadrangular shape including four edges, and
the plurality of first connection bumps are arranged on all four corner regions of the bottom surface of the semiconductor chip, and
each corresponding corner region, among the four corner regions, is a triangular area defined by a corresponding one of four vertices where a first one of the four edges of the bottom surface of the semiconductor chip and a second one of the four edges of the bottom surface of the semiconductor chip meet, a first location along the first one of the four edges that is a first distance from the corresponding one of four vertices, a second location along the second one of the four edges that is a second distance from the corresponding one of the four vertices, and a line overlapping two of the plurality of first connection bumps provided the line extends from the first location along the first one of the four edges of the bottom surface of the semiconductor chip to the second location along the second one of the four edges of the bottom surface of the semiconductor chip.

18. The semiconductor chip of claim 16, wherein
the first conductive connection structure includes a plurality of conductive layers and a plurality of conductive vias,
the plurality of conductive layers are located at different levels,
the plurality of conductive vias extend between the plurality of conductive layers,
at least one of the plurality of conductive layers has a plate shape, and
the plurality of conductive vias are arranged in a two-dimensional array on a surface of the at least one of the plurality of conductive layers having the plate shape.

19. The semiconductor chip of claim 16, wherein
the cover insulating layer includes a first insulating layer and a second insulating layer,
the first insulating layer is in contact with the conductive reinforcing layer and the pad layer,
the second insulating layer is on the first insulating layer,
the first insulating layer includes an oxide, and
the second insulating layer includes a polyimide.

* * * * *